United States Patent [19]

Mordan

[11] 3,975,684
[45] Aug. 17, 1976

[54] SWEEP GENERATOR APPARATUS AND METHOD
[75] Inventor: William J. Mordan, Colorado Springs, Colo.
[73] Assignee: Hewlett-Packard Company, Palo Alto, Calif.
[22] Filed: Sept. 11, 1974
[21] Appl. No.: 505,186

[52] U.S. Cl. ............................. 324/185; 324/99 D; 324/183
[51] Int. Cl.² ........................................... G04F 8/00
[58] Field of Search................. 324/185, 183, 99 D; 307/235; 328/146, 148, 151

[56] References Cited
UNITED STATES PATENTS

| 3,414,812 | 12/1968 | Niel | 324/183 |
| 3,664,744 | 5/1972 | Liston | 324/99 D |
| 3,728,626 | 4/1973 | Douglas | 324/99 D |
| 3,745,556 | 7/1973 | Doreg | 324/99 D |

Primary Examiner—R. V. Rolinec
Assistant Examiner—Michael J. Tokar
Attorney, Agent, or Firm—A. C. Smith

[57] ABSTRACT

An improved sweep circuit for an oscilloscope or the like has an adjustably delayed sweep which is time shared to display separate recurring events of interest alternately to provide an apparently simultaneous display of the events. The adjustable delay between sweeps may be directly indicated as a time interval between sweeps.

11 Claims, 7 Drawing Figures

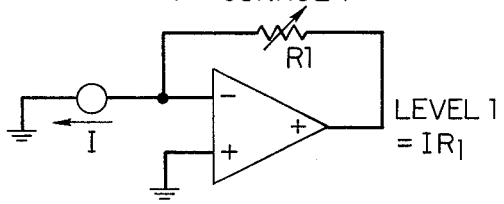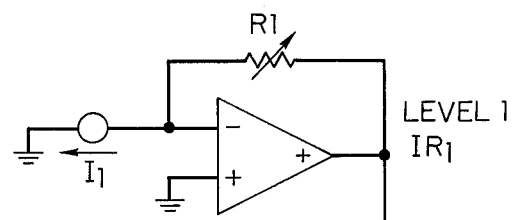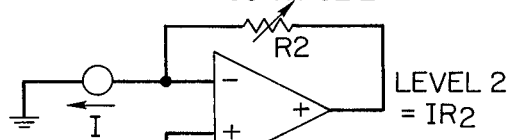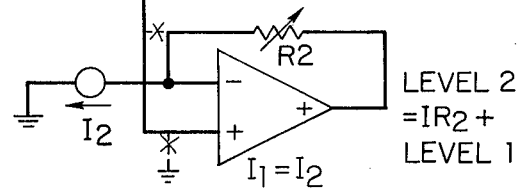
Figure 2
Figure 3
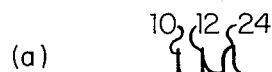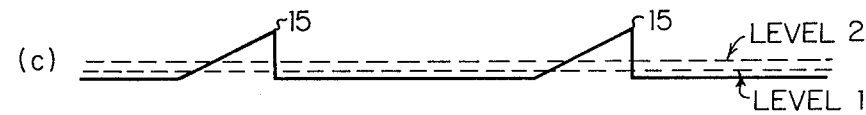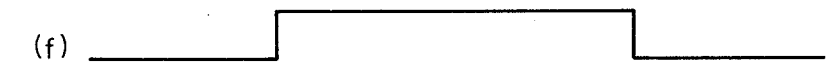
Figure 4
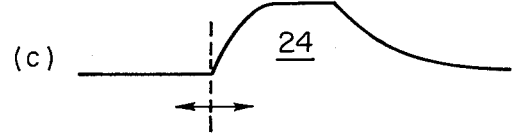
Figure 5

SWEEP GENERATOR APPARATUS AND METHOD

BACKGROUND OF THE INVENTION

Time interval measurements may be made on certain known oscilloscopes by adjusting a delay circuit to display an event of interest in coincidence with a reference mark on the display screen. Thereafter, the display of another event of interest may be moved to the reference mark by adjusting a delay circuit. The difference between the delay adjustments thus required may be calculated to determine the separation between the separate events of interest.

SUMMARY OF THE INVENTION

In accordance with the present invention, time-interval measurements between recurring events may be determined directly by alternately and rapidly displaying the selected events for apparent simultaneous viewing and by adjusting the respective delay circuits for each event to locate the events in overlapping relationship at any convenient position on the display screen. The time interval between such events may then be read directly.

DESCRIPTION OF THE DRAWINGS

FIGS. 2 and 3 are schematic diagrams of delay control circuits for operation in the circuit of FIG. 1.

FIG. 4 is a graph showing the time-varying waveforms of signals during operation of the sweep generator of FIG. 1; and FIGS. 5a–c are pictorial representations of the displayed events of interest.

DESCRIPTION OF THE PREFERRED EMBODIMENT

Figure 1:
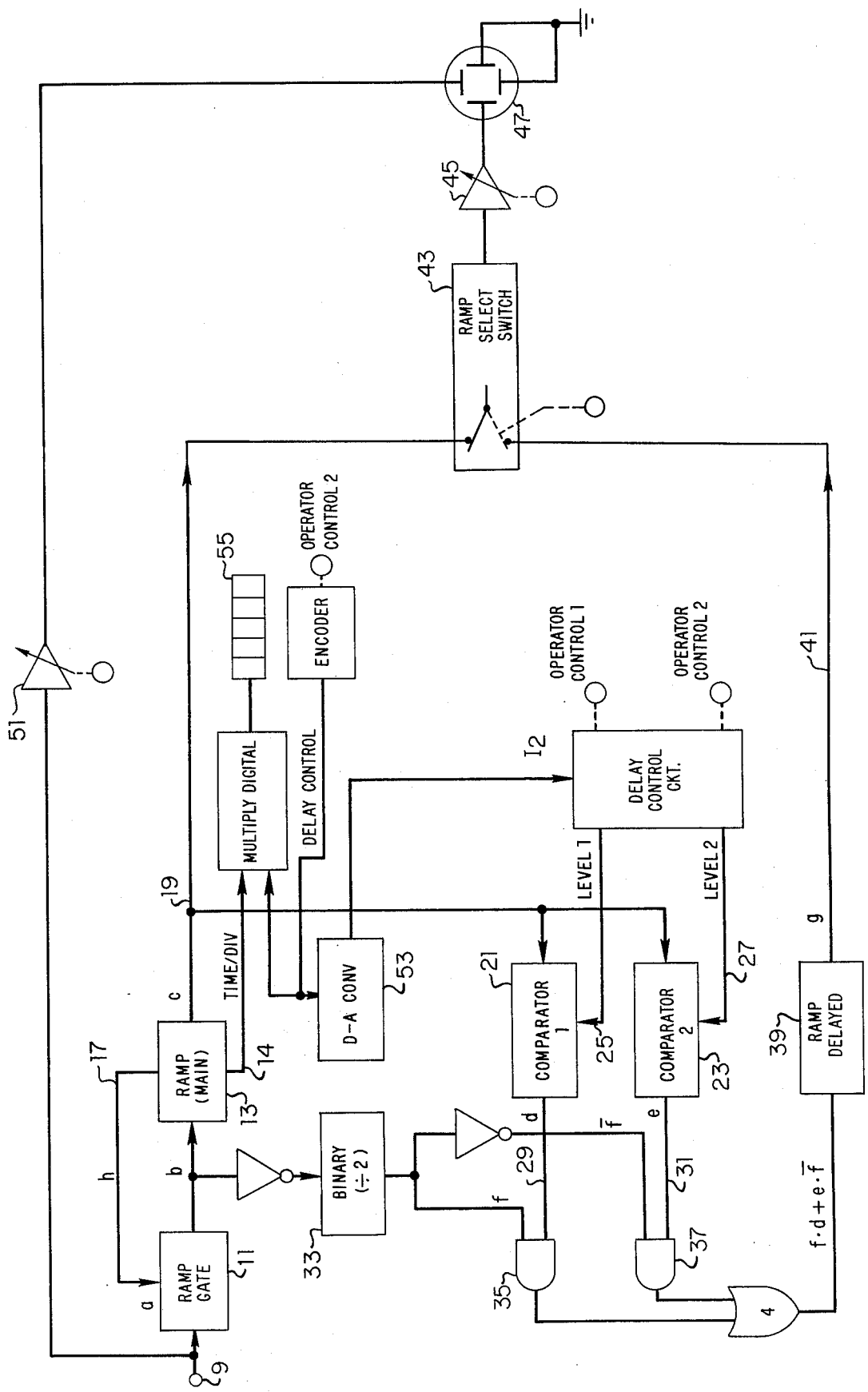
FIG. 1 is a block schematic diagram of the sweep generator of the present invention.

Referring now to the schematic diagram of FIG. 1, there is shown an input 9 for receiving recurring signals to be displayed. These signals may include successive events, for example, as shown in FIG. 4a, which are spaced apart an unknown time interval in each recurrence which it is desirable to determine. The ramp gate circuit 11 may include synchronizing circuitry for triggering upon an initial event 10 in the succession of events, as shown in FIG. 4b. This initial triggering by the ramp gate circuit 11 initiates the main ramp generator 13 to produce a continually-changing signal having a substantially constant slope, as shown in FIG. 4c. At the conclusion of the main ramp, for example as determined in a conventional manner by attainment of the level 15, as shown in FIG. 4c, the ramp gate circuit 11 is disabled by the signal appearing on line 17, thereby to terminate the main sweep.

This main sweep is applied to comparators 21 and 23 which are also connected to receive controllable input signals at their inputs 25 and 27, respectively. Thus, the outputs on lines 29 and 31 from the comparators 21 and 23, respectively occur with respect to the start of the main ramp at times determined by the levels of signals applied to the inputs 25 and 27, respectively, of these comparators. The comparator output signals are combined with the output derived from binary divider 33 to alternately and cyclically enable the gates 35 and 37. The delayed ramp signal generator 39 is triggered alternately and cyclically upon the enabling of one of the gates 35 and 37, and the time at which the delayed ramp signal generator 39 is actuated with respect to the synchronizing event detected by the ramp gate 11 is thus determined by the levels of signals applied to the inputs 25 and 27 of the comparators 21 and 23, respectively. When thus actuated, the delayed ramp sweep generator 39 produces a ramp signal, for example as shown in FIG. 4g, having a greater slope than the main ramp signal derived from ramp generator 13. Both the main ramp signal on line 19 and the delayed ramp signal on line 41 are applied to a ramp-signal selecting switch 43 for application through the horizontal deflection circuitry 45 to the horizontal deflection plates of a cathode ray tube 47. The recurring signals to be displayed appearing at input terminal 9 are applied to the vertical deflection plates of the cathode ray tube 47 through the vertical deflection circuitry 51.

In operation, the main ramp signal from generator 13 may be applied to the horizontal deflection circuitry by setting the selector switch 43 to provide a time-varying sweep signal for conventional viewing of the applied signals. The applied input signal is thus displayed on the cathode ray display tube 47 as shown in FIG. 5a. When the ramp select switch 43 is set in the delayed position the selected events may be displayed in a form as shown in FIGS. 5b and c. Since the delayed ramp signal on line 41 is of greater slope than the main ramp signal on line 19, the time scale along the x-axis is expanded from the time scale for the display of the applied signal, as shown in FIG. 5, using the main sweep. It should be noted, however, that the setting of the signal level applied to the input 25 of comparator 21 determines when the delayed ramp signal on line 41 will be initiated. Similarly, it should be noted that the level of signal applied to the input 27 of comparator 23 determines when the delayed ramp signal on line 41 will be initiated in the alternate half cycle of operation. Thus, these levels may be set by the operator in order to initiate the delayed sweep signal from 39 at times during the sequence of events that are delayed from the synchronizing event but which precede the occurrence of the selected event to be displayed on the delayed sweep. For rapidly recurring signals at input 9, the time-shared displays of two selected events on the display screen of cathode ray tube 47 appear simultaneously and thus can be relatively positioned in the screen by adjusting the levels of signals on inputs 25 and 27. Also, the adjustment of the levels of these signals has the effect of moving the signals as shown in FIGS. 5b and c with respect to an initiating or synchronizing event. Thus, by adjusting the levels of signals applied to inputs 25 and 27 to display the signals as shown in FIGS. 5b and c, say, with their initial rise portions of the curves in overlapping relationship, the levels of the signals at inputs 25 and 27 will be proportional to the time intervals between these positions on the waveforms of the selected events. The difference between these two signal levels may be detected, for example, by analog-to-digital converter in one embodiment for displaying an indication of the time interval between the selected events in digital form on a display register. The delay control circuit which provides the adjustable signal levels at inputs 25 and 27 may be constructed as shown in FIG. 2. In that embodiment, each of the manually adjustable controls may include a variable resistor connected, for example, in operational feedback arrangement around a differential amplifier for establishing the output level at a value which positions a selected event in a desired location on the display screen. The difference between the two output levels thus established is proportional to the time interval between the selected events and may be read out directly.

In another embodiment, the delay circuit may be arranged as shown in FIG. 3. The resistor $R_2$ may be a fixed value, and the current source $I_2$ may be the output of a digital-to-analog converter 53, as shown in FIG. 1. The digital input signal to the converter 53 may be derived from an encoder under control of an operator. This converter input will therefore be proportional to the difference between levels 1 and 2 and hence to the time interval between selected events. The input to the converter 53 is also applied to digital multiplier 16 whose multiplication factor is determined by the signal on input 14. This input signal 14 may be determined by the time-per-division setting of the ramp slope from the generator 13 such that the multiplied digital input will represent the desired time delay in seconds that can be displayed on register 55.

I claim:
1. Electronic circuit apparatus comprising:
   main generator means which responds to a trigger signal applied thereto for producing an output signal which varies monotonically with time;
   a plurality of comparator means, each having an input connected to receive said output signal from said main generator means for comparison with a signal applied to another input thereof, each of said comparator means producing a trigger signal in response to the signals applied to the inputs thereof attaining a predetermined relationship;
   means coupled to each said another input of said comparator means for applying signals thereto;
   delayed sweep generator means for producing a sweep signal in response to a trigger signal applied thereto;
   circuit means coupled to said comparator means and to said delayed sweep generator means and responsive to the trigger signals applied to the main generator means for applying trigger signals alternately thereto from said comparator means; and
   means coupled to said comparator means for producing an output indication of the time interval between appearance of trigger signals produced by said comparator means.

2. Electronic circuit apparatus as in claim 1 wherein said delayed sweep generator means includes auxiliary generator means for producing said sweep signal, and said circuit means responsive to trigger signals applied to said main generator means includes gate means connected to said selectively pass the trigger signals produced by each of said comparator means for initiating said auxiliary generator means in alternate and cylic response to the appearance of trigger signals from said comparator means.

3. Electronic circuit apparatus as in claim 2 wherein said circuit means includes binary divider means and gate circuitry connected to the comparator means for alternating the trigger signals therefrom which initiate said auxiliary generator means in response to recurring trigger signals applied to the main generating means.

4. Electronic circuit apparatus as in claim 1 comprising deflection circuit means connected to produce a deflection signal in response to a selectable one of the signals produced by said main and auxiliary generating means.

5. Electronic circuit apparatus as in claim 1 comprising means coupled to said another input of each of said comparator means for producing an output indication representative of the difference between the values of signals applied thereto.

6. Electronic circuit apparatus as in claim 5 comprising delay control circuitry for selectably varying the values of signals applied to said another input of each of said comparator means.

7. Electronic circuit apparatus as in claim 1 comprising:
   display means including horizontal and vertical-coordinate display axis and an input therefor for receiving applied signal, and having a horizontal-coordinate display axis and an input therefor for receiving sweep signals applied thereto; and
   selector means coupled to the main generator means and to the delayed sweep generator means for selectively applying the output signal and sweep signal therefrom to the input for the horizontal-coordinate display axis of the display means.

8. Electronic circuit apparatus as in claim 7 wherein:
   said sweep signal varies with time at a rate faster than said output signal; and
   said selector means is coupled to the input for the horizontal-coordinate display axis for applying selected one of the output signal and sweep signal thereto.

9. Method of controlling generation of an output signal comprising the steps of:
   initiating a main sweep to produce an output having a parameter that varies monotonically in value with time in response to each recurring input event;
   comparing the main sweep with a pair of reference values for producing a trigger output in response to the main sweep attaining a predetermined relationship to a reference value; and
   responding to the occurrence of input events for initiating the output signal in response alternately to the main sweep attaining a predetermined relationship to each of the reference values.

10. The method according to claim 9 comprising the additional step of:
    producing an output manifestation of the time interval between initiations of output signals relative to input events as a representation of the difference between reference values.

11. The method according to claim 9 wherein the output signal has a parameter that varies monotonically in value with time following initiation thereof, and comprising the additional step of alternately selecting the main sweep and the output signal for use as a time-scale reference signal.

* * * * *